United States Patent
Keller et al.

(10) Patent No.: US 11,078,025 B2
(45) Date of Patent: Aug. 3, 2021

(54) LIGHTWEIGHT ROLLER

(71) Applicant: Chemcut Holdings LLC, State College, PA (US)

(72) Inventors: Rodger Lee Keller, Petersburg, PA (US); Gerald Myron Reitz, Bellefonte, PA (US); Charles Robert Seager, Alexandria, PA (US); Stanley Bryan Smith, Boalsburg, PA (US)

(73) Assignee: Chemcut Holdings LLC, State College, PA (US)

( * ) Notice: Subject to any disclaimer, the term of this patent is extended or adjusted under 35 U.S.C. 154(b) by 0 days.

(21) Appl. No.: 15/819,431

(22) Filed: Nov. 21, 2017

(65) Prior Publication Data

US 2019/0152713 A1   May 23, 2019

(51) Int. Cl.
  *B65G 39/02*   (2006.01)
  *H01L 21/677*   (2006.01)
  *B65G 13/02*   (2006.01)

(52) U.S. Cl.
  CPC ........ *B65G 39/02* (2013.01); *H01L 21/67706* (2013.01); *B65G 13/02* (2013.01)

(58) Field of Classification Search
  CPC ........ B65G 39/02; B65G 39/07; B65G 39/10; H01L 21/67706
  USPC .......................................................... 193/37
  See application file for complete search history.

(56) References Cited

U.S. PATENT DOCUMENTS

| | | | | |
|---|---|---|---|---|
| 6,213,287 B1* | 4/2001 | Juracko | .................. | B65G 45/16 198/499 |
| 6,550,609 B2* | 4/2003 | Coen | ..................... | B65G 39/02 193/37 |
| 7,033,468 B2* | 4/2006 | Hubei | ................. | C25D 7/0657 204/199 |
| 9,052,039 B2* | 6/2015 | Mettee, II | ............... | B29C 48/11 |
| 2005/0150589 A1* | 7/2005 | Amos | ................... | B29C 43/222 156/209 |
| 2008/0142358 A1* | 6/2008 | Schmid | ............... | C25D 7/0621 204/297.01 |
| 2011/0024043 A1* | 2/2011 | Boock | ............... | A61B 5/14532 156/345.24 |
| 2020/0128837 A1* | 4/2020 | Dev | ..................... | A23B 5/0052 |

FOREIGN PATENT DOCUMENTS

WO   WO-2015010158 A1 *   1/2015   ............. B65G 39/02

OTHER PUBLICATIONS

WO-2011151487-A1 (Year: 2011).*

* cited by examiner

*Primary Examiner* — Gene O Crawford
*Assistant Examiner* — Lester Rushin, III
(74) *Attorney, Agent, or Firm* — Ference & Associates LLC (57) ABSTRACT

One embodiment provides a lightweight roller, including: a cylindrical tube manufactured using a lightweight material; the cylindrical tube comprising a first end, a second end substantially opposite the first end, and an outer surface; and at least one end cap attached to at least one of the first end and the second end. Other aspects are described and claimed.

17 Claims, 7 Drawing Sheets

LIGHTWEIGHT ROLLER

BACKGROUND

Conveyors facilitate the movement of material or goods from one location to another. For example, many manufacturing or shipping processes move components or products along an assembly line or from one area to another using a conveyor. Some machines may also have conveyor systems located within the machine to move materials from one location within the machine to another location within the machine. Conveyor systems may include rollers, for example, along the length of the conveyor system. Some conveyor systems may also include a belt, for example, located over the rollers where the rollers cause the belt to move. These conveyor devices and components within must be built solidly to withstand the constant use and wear over time. Since the conveyors are robustly constructed, conveyor rollers may damage some sensitive or fragile materials.

BRIEF SUMMARY

In summary, one aspect provides a lightweight roller, comprising: a cylindrical tube manufactured using a lightweight material; the cylindrical tube comprising a first end, a second end substantially opposite the first end, and an outer surface; and at least one end cap attached to at least one of the first end and the second end.

Another aspect provides a method of manufacturing a lightweight roller, comprising: manufacturing a cylindrical tube with a first end, a second end substantially opposite the first end, and an outer surface from a lightweight material; and attaching at least one end cap to at least one of the first end and the second end.

A further aspect provides a lightweight conveyor roller system, comprising: a conveyor roller device; and a plurality of cylindrical tubes manufactured using a lightweight material; each of the cylindrical tubes comprising a first end, a second end substantially opposite the first end, and an outer surface; and a first end cap for each of the cylindrical tubes, wherein the first end cap is attached to the first end of the corresponding cylindrical tube; a second end cap for each of the cylindrical tubes, wherein the second end cap is attached to the second end of the corresponding cylindrical tube; wherein each of the first end caps and the second end caps comprise an attachment mechanism for attaching the cylindrical tubes to a position of the conveyor roller device.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE SEVERAL VIEWS OF THE DRAWINGS

FIG. 1 A-B illustrates a front view of a roller embodiment as compared with a traditional roller.

FIG. 2 A-C illustrate a configuration of a plurality of rollers of an embodiment.

FIG. 5 A-B illustrate a top and front view of a plurality of rollers of an embodiment.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Manufacturing processes face a challenge to maintain efficiency and speed while keeping material breakage or damage to a minimum. Thus, many manufacturing facilities utilize conveyor systems to quickly and efficiently move material from one location to another. Automated conveyor systems are used in assembly lines, machinery, shipping and packing lines, and the like. Many conveyor systems contain rollers upon which material moves. Additionally, other systems may use a combination of rollers and belts, for example, with belts placed over the rollers. Current rollers for conveyor systems are built and designed to withstand constant use over a long lifespan. However, due to the need for robustness, the rollers tend to be made of heavy duty materials which tend to make the rollers heavy. Heavy rollers may cause problems with movement of some materials, for example, rollers that move fragile or sensitive components such as electronic components and glass. Less damaging rollers that can still hold up to the constant use for use in conveyor systems are needed, particularly for these applications.

The manufacturing of electronic devices includes many different processes that require the movement of material from one location to another location. For example, when processing a silicon wafer to be used in the construction of an electronic device, the wafer must be processed through many different machines to create traces, connections, and the components of the electronic device. The silicon wafers are very thin and very fragile and can be broken, scratched, or cracked with very little pressure, which can result in scrapping of the entire wafer, which can be very costly. Accordingly, many fabrication facilities automate as much of the fabrication process as possible. Automation reduces human error and possible contamination and also helps prevent breakage or scrapping. Semiconductor boards have become increasingly thinner and more fragile with more electrical connections and components. Moving these semiconductor boards through an assembly line may be a challenge due to their fragile nature. Compression, warping, and the like may easily damage the semiconductor circuit boards. This damage or breakage may slow production, increase personnel costs, increase production costs, and result in downtime of the assembly process.

One area where breakage occurs is the movement of the wafer from one location to another location. The movement of the wafer is typically done use a robot or conveyor system. Since the tolerances are so tight and the wafers are so fragile, this movement is a likely area of breakage or scratching. Thus, an ideal movement system results in as little force being applied to the wafer as possible. Accordingly, conventional rollers may be too heavy and cause the unwanted scratching or breakage. Thus, a lightweight roller may lessen the damage caused by conveyor systems.

However, another consideration when creating tools for transporting materials from one location to another is the environment of the roller. For example, many manufacturing processes require coating a component with a fluid or otherwise exposing the material to a fluid, slurry, or other material that may be transferred (either intentionally or accidentally) from one area to another. For example, a component may need to be put through a pH basic or acidic wash/bath at a particular step in the manufacturing process. Conveyor rollers in such environments must be able to withstand moisture, pH extremes, and other damaging environments.

Conventional conveyor rollers may have a shorter useful life in the conveyor system when exposed to fluids, and especially when exposed to extreme pH environments. Thus, conventional rollers are generally made of a material that will resist corrosion or damage when exposed to these environments. This is another reason that the choice of materials for a conventional roller tends to be a heavy material, because these are the materials that are able to withstand the damaging environments due to their non-porous nature, chemical resistive nature, and the like. Alternatively, the surface of the roller may be coated with a material that may protect the roller from fluid environments and increase the service life of a roller. In this case the material chosen for the roller must allow adhesion of the material to the roller.

Conventional conveyor systems may use a roller that has a hard surface. For example, common types of rollers may use a metal stock such as steel or aluminum, or a hard plastic as the base material for manufacturing of the rollers. These conventional rollers may perform well at moving material. However, they may damage sensitive components or products. This damage may be due to the weight of the roller itself exerting force upon a material. When material moves along a roller a pressure point is created in a line along the longitudinal axis of the roller as the material moves across the roller. These pressure points may damage, break, warp, or render the part or material useless.

What is needed is a roller that moves material properly, but is less damaging to components or products moving across the roller. A roller by design has a circular cross section. Therefore, at any given time, only a small portion of the roller is in contact with the material. In some applications, rollers may be disposed on one side or on both sides of a product to move material. These roller configurations may move material in a flat plane, up or down inclines, or through intricate routes.

Accordingly, an embodiment provides a lightweight roller. For ease of reading the term roller refers to a lightweight roller or a conveyor roller device, unless stated otherwise, for example, by the use of the term conventional roller, traditional roller, or the like. A roller with a soft outer surface or made of a lightweight material helps to prevents damage to material. While the soft outer surface or lightweight material retains the roller function, the soft outer surface or lightweight material lessens the pressure the conveyed material receives at the contact point along the length of the longitudinal axis of the roller. Thus, such a design maintains the function of the roller while preventing breakage to material. Less breakage translates into more efficient conveyors systems, less down time, less personnel costs, and less cost due to material breakage. Additionally, the chosen material and/or coating provides a roller that is resistive to chemicals, corrosion, and the like, so the roller can be used in the same environments as the traditional rollers.

In an embodiment, the roller may be a tubular structure, for example, having a hollow portion or core, made of a lightweight composite material, for example, carbon fiber, fiberglass, graphene, or the like. The term composite material will be used here throughout to refer to the material that the roller is manufactured from. However, it should be understood that any lightweight material, not just a composite material, may be used for the construction of the roller, as long as the material retains the attributes as described herein.

In an embodiment, the roller may have additional material on the outer surface. The additional material may act as a coating for chemical resistivity, to prevent sticking, to allow for particular textures on the roller, or the like. For example, the outer surface may be shrink wrapped, over molded, wrapped in a sleeve, or the like. The outer surface material may be polytetrafluoroethylene (PTFE), polypropylene (PP), polyvinylidene fluoride (PVDF), plastic elastomer (PE), or the like. The lightweight roller may be used in a conveyor, conveyor containing machine, or the like. The outer surface material and lightweight material may be used in combination or separately. Additionally, the lightweight material may be used as a core or coating for a different material. For example, the lightweight material may be used to make a core that is then covered with aluminum or a different material to create the roller, or vice versa.

In an embodiment the outer surface material and/or lightweight material may decrease damage to a component or product moving along the roller. As discussed above, a roller represents a point of pressure upon an object. Thus, a roller with a lighter weight due to a lighter material or hollow core may exert less pressure upon an object moving across the roller. This is especially true if the roller is above a material and the weight of the roller rests upon the material. The addition of an outer surface material may allow the roller to be softer. The outer surface material may also be of a material that in non-reactive to solutions, provides grip, prevents sticking, or the like, of a material passing upon a roller outer surface. The outer material may also protect the roller from liquid of extreme pH environments. Thus, as described herein, the roller is a lightweight roller that is resistive to chemicals and is also stable in temperature extremes. For example, if the environment results in wide temperature ranges, traditional rollers may expand, crack, or otherwise become damaged due to the temperature changes. The lightweight roller as described herein is made of a material that can withstand these temperatures changes.

The illustrated example embodiments will be best understood by reference to the figures. The following description is intended only by way of example, and simply illustrates certain example embodiments.

Figure 1A:
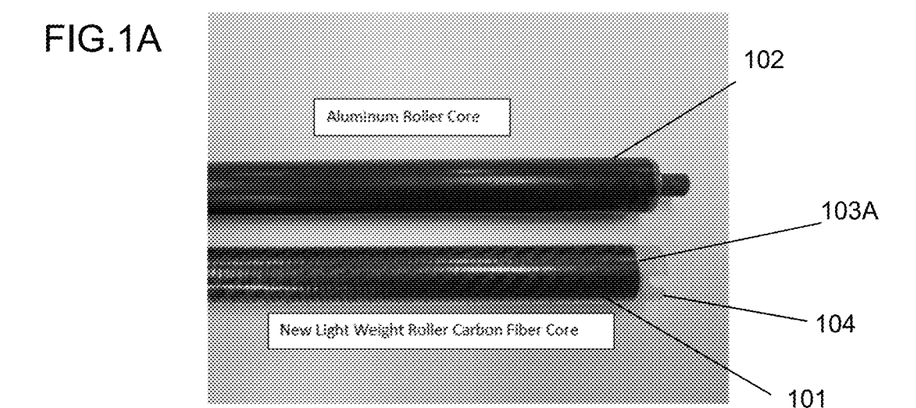
Figure 1B:
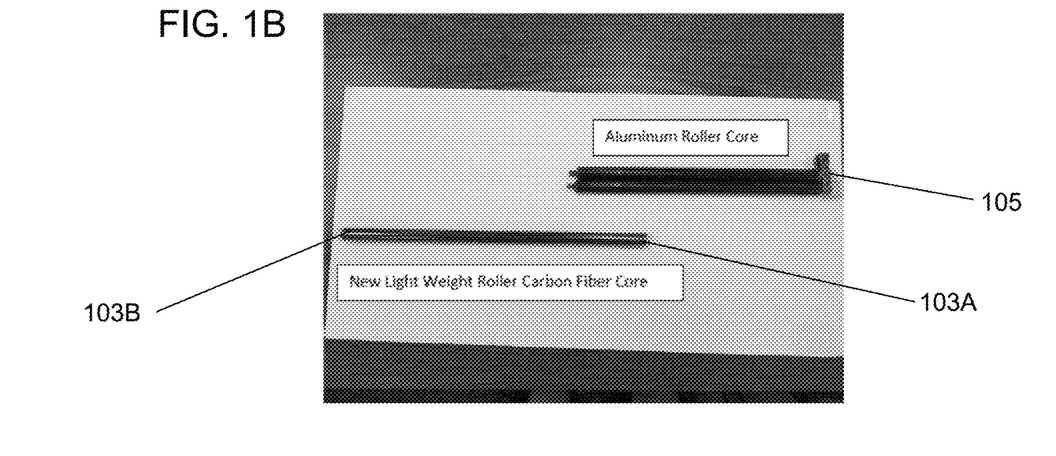

FIG. 1 A-B illustrates a front view of a roller core in an embodiment. FIG. 1A shows a front view of a lightweight roller carbon fiber core 101 in an embodiment (bottom) as compared to an aluminum roller core (top) 102. The roller may have a cylindrical shape and may be solid or may be tubular with a hollow core to lessen the weight. A roller core may have a first end and a second end substantially opposite the first end. In the example of FIG. 1 A-B, the first and second ends 103A and 103B (one of which is not shown in FIG. 1A) may include the end having an attachment mechanism 104. While a different attachment mechanism is shown for the carbon fiber roller than in the aluminum roller 105, it should be understood that either attachment mechanism, a different attachment mechanism, or no attachment mechanism may be used with the carbon fiber roller. The attachment mechanism will be described in more detail below.

The lightweight roller may be any composite material, for example, the lightweight roller core may be carbon fiber, fiberglass, or any lightweight material. The term "core" will be used here throughout. However, it should be understood that the roller may be a solid piece (i.e., having no hollow portion), a hollow tubular structure (i.e., the term core referring to the material creating the hole), made of two materials (e.g., having an insert of one material and an overlay of another material, etc.), and the like. Accordingly, the term core refers to the roller material not including the outer surface overlay material, as discussed in more detail below.

In an embodiment, the lightweight roller may be carbon fiber such as carbon fiber tube. The carbon fiber tubing may contain multiple layers of high strength unidirectional carbon fiber prepped. The carbon fiber tubing may have a twill fabric exterior. This carbon fiber tubing may be a telescoping carbon fiber. The carbon fiber tubing may be roll-wrapped. The outside diameter may be selected for the conveyor system usage. The wall thickness (thickness between an outer diameter and an inner diameter) may also be selected for system usage, desired strength, and desired weight of a roller for a given application.

Referring to FIG. 1B, a roller core may have an end cap or end plug 105. The end cap may be on one or both ends of the roller core. While the end cap or end plug as shown in FIG. 1B includes an attachment mechanism and drive mechanism, the end cap refers to any material or component that covers, attaches to, plugs, or is otherwise coupled to one or more ends of the roller core. Thus, the end cap may be solid, contain an aperture, have a drive mechanism, have an attachment mechanism, or the like. A drive mechanism may be a keyhole, slot, gear, cog, friction plate, clutch, bushing, bearing, or the like. The end cap may serve as an adapter or attachment mechanism to place into or otherwise attach the roller core to a machine, conveyor device, or the like. The end cap may be a component of the drive mechanism. The end cap and roller core may freely rotate about its longitudinal axis, be driven in the longitudinal axis, allow the roller to float or bounce about a material, allow the roller to be adjusted to different pressure exerted upon a material moving along the roller, or the like. In an embodiment a plurality of roller cores and end caps may be used to achieve proper movement of a material, for example, in a conveyor system as shown in FIG. 2A-C.

Figure 2A:
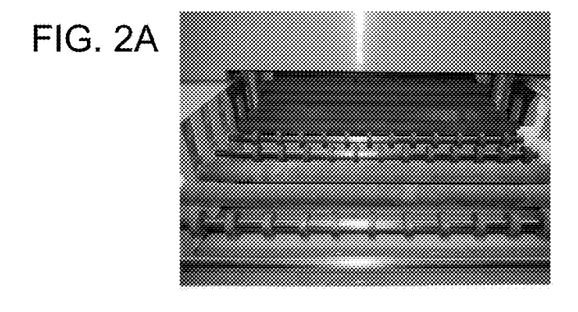
Figure 2B:
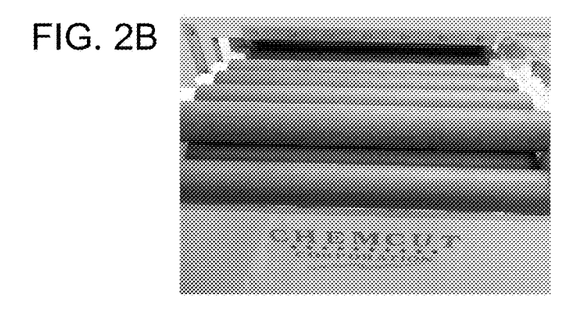
Figure 2C:
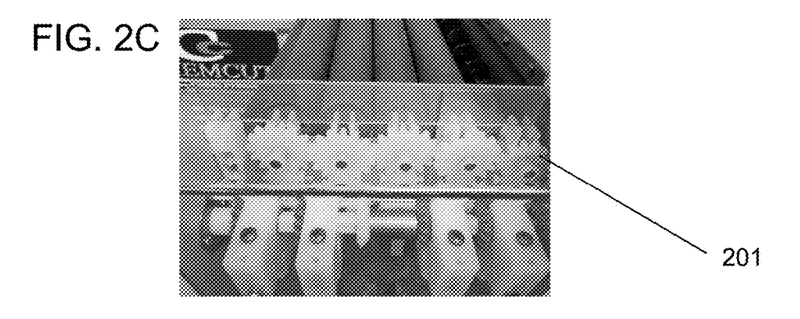

FIG. 2 A-C illustrates different embodiments of roller core systems. In general, rollers serve to move material along a desired pathway through a manufacturing process, a machine, or the like. In FIG. 2A a roller system is illustrated using a plurality of rollers with different diameters. Rollers may have a uniform diameter along their length or have different diameters along their length, for example, having rings that contact the material to be moved. In an embodiment, the longitudinal length of the roller may be relatively short, often referred to as a "skatewheel" in conveyor systems. Rollers may be disposed in a system in a uniform density along a path or at different densities. In other words, the rollers may be equally spaced within the conveyor system or may be placed having different distances between the rollers.

In FIG. 2B, a plurality of rollers may be disposed on both sides of a material to be moved in an embodiment. Contact on both sides of a material may support a material or improve the speed or accuracy of the material movement. The spacing of rollers between which material moves may be selected to provide enough contact of the roller to provide desired movement of the material. Additionally or alternatively, the spacing of rollers between which material moves may be selected to provide less pressure to decrease damage to material. A roller or a plurality of rollers may be adjusted to provide proper tracking and tensioning of the material to be moved.

In FIG. 2C, one or more rollers may be driven using a driving mechanism 201. Thus, FIG. 2C illustrates an embodiment in which the end caps have a gear driven by a complementary drive gear. The drive gear may be an end cap gear on another adjacent roller core (e.g., the rotation of one roller causes rotation of another roller, etc.), may be a part of the conveyor system (e.g., as a worm gear, drive gear, etc.), or the like. Selection of gear ratios and drive speeds may adjust the rate at which the material moves through the conveyor system.

Figure 3:
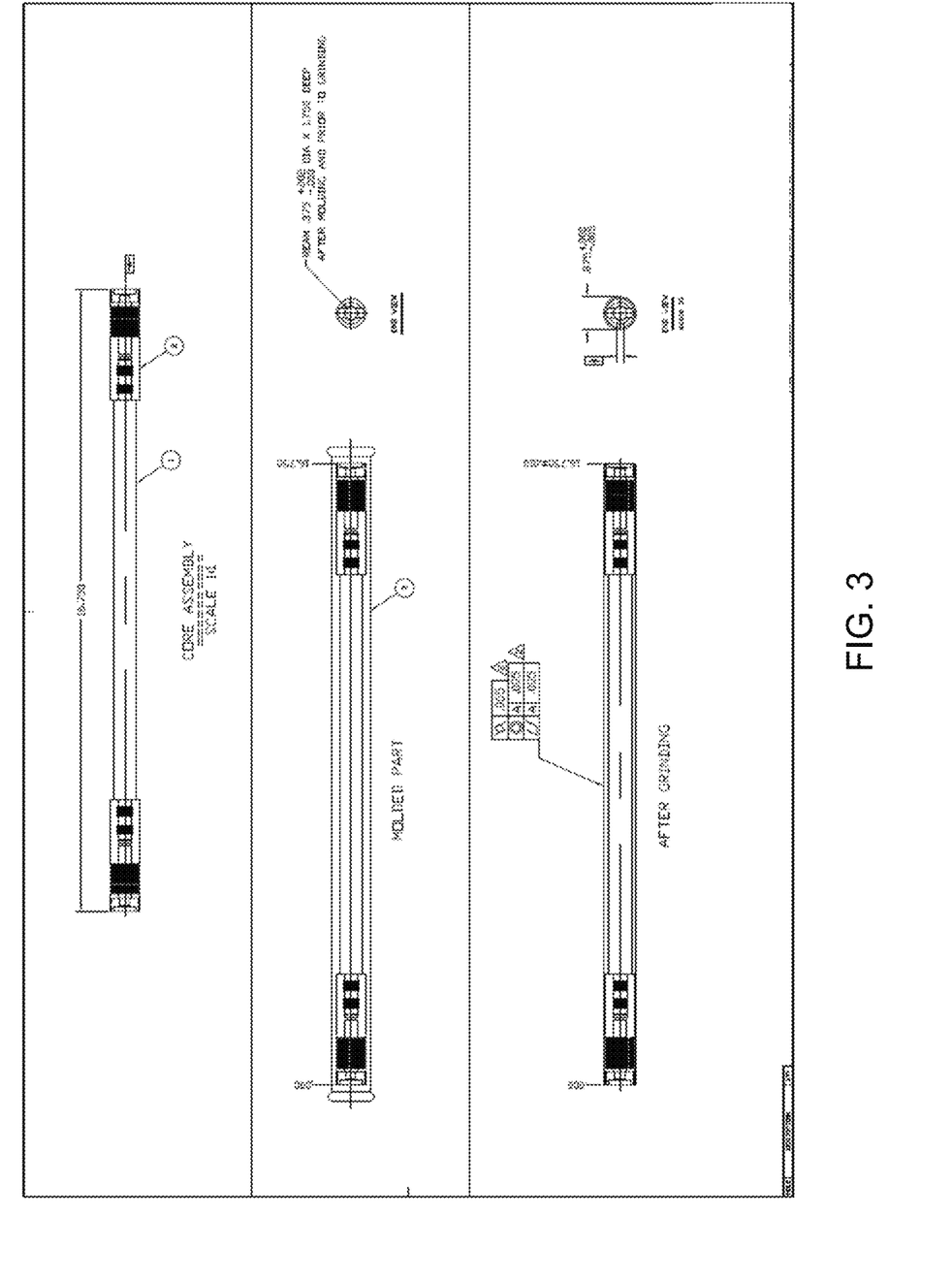
FIG. 3 illustrates a front view schematic of a roller embodiment.

Referring to FIG. 3, a side view schematic of a roller core embodiment is shown as the roller core is manufactured. The dimensions illustrated are merely illustrative and intended to be used as examples. Different dimensions are used and are generally based upon the application of the roller. The top panel illustrates a roller core 1 which may be constructed of a lightweight material. The lightweight material may be a composite material such as carbon fiber, fiberglass, or the like. Different longitudinal lengths and different diameter cross sections of the roller core are contemplated and disclosed. The dimensions may be selected based upon a specific application or use of the roller core. End caps may be attached to the roller core, and are disclosed and described above. Attachment of end caps to the roller may be by glue, adhesive, bolts, screws, compression, included during manufacture, or the like.

Carbon fiber may be produced from carbon filaments produced from a polymer precursor. The precursor may be spun in to yarns which undergo chemical and mechanical manipulations to align the polymer atoms. Heat may be applied to perfect carbonization to produce carbon fiber. Further heat treatment may achieve graphitization. Machining, grinding, or sanding of the composite material may be performed on the ends of the roller, the outer surface of the roller, and the inner surface of the roller to achieve proper tolerances, surface preparation, or the like.

A lightweight roller may be molded from carbon fiber to produce a roller core (FIG. 3, middle panel). In an embodiment, an outer surface material 3 may be added to the roller core. In an embodiment, there may be a further step of grinding the roller core (FIG. 3, bottom panel). The grinding of the roller core may be performed to achieve a required tolerance, for example, a specific diameter of the roller core. The grinding may change the surface texture or appearance of the roller core. The grinding may allow an outer surface material to be applied on the roller core. Application of an outer surface material may include over molding, shrink wrapping, sleeve application, or the like.

Figure 4:
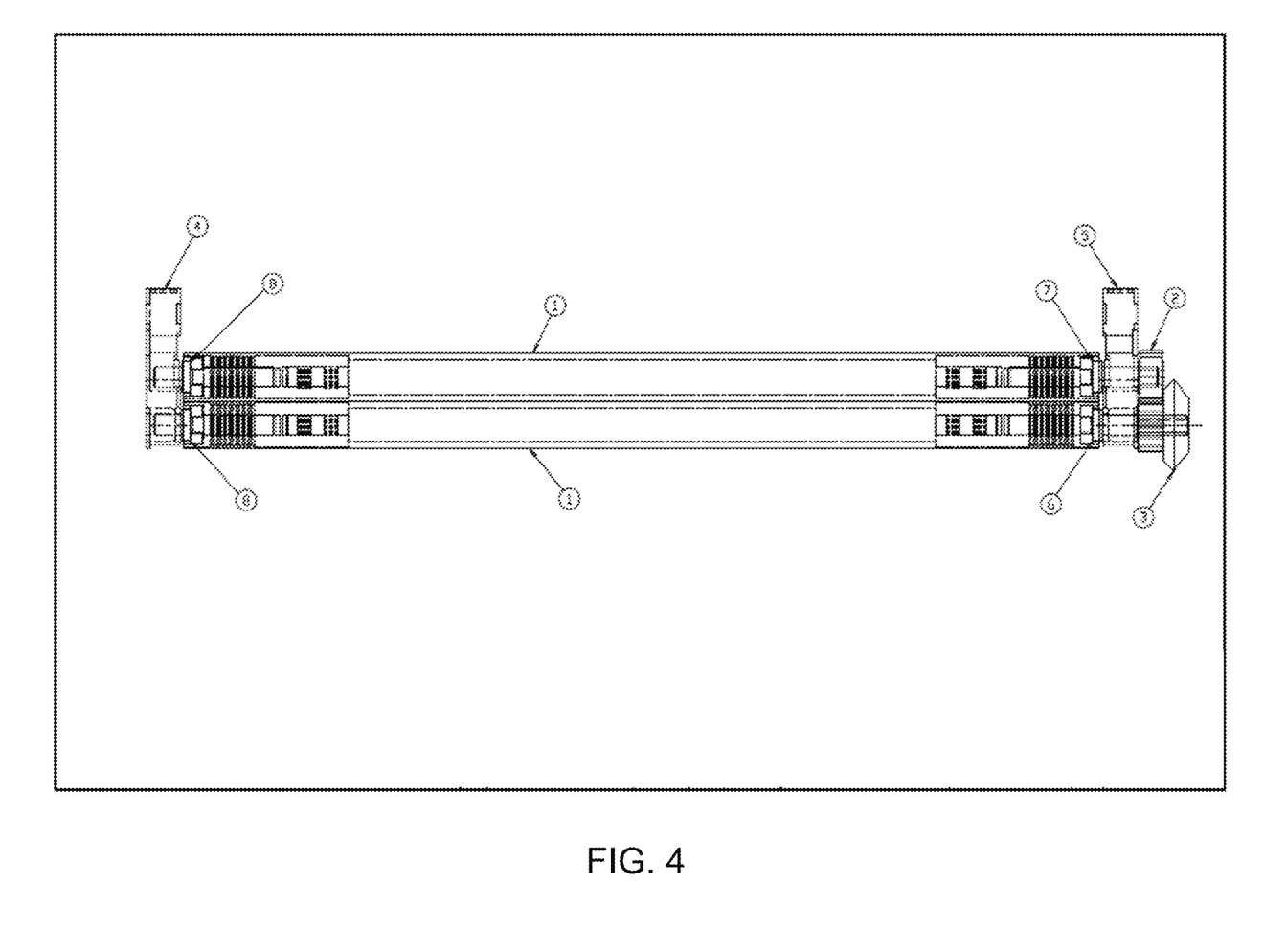
FIG. 4 illustrates a front view schematic of a plurality of rollers of an embodiment.

Referring to FIG. 4, a plurality of roller cores may be disposed in a conveyor system. These plurality of rollers may be attached together, for example, by way of a single end cap, single attachment mechanism, or the like. Different applications may require single roller configurations, double roller configurations, other roller configurations, or a combination thereof. For example, a plurality of roller cores may allow proper structural support for a material or direct material through a path in a system. A plurality of roller cores with associated end caps 7 in concert with a driving mechanism 2, 3 allow a conveyor system to move material. For example, roller cores may be placed to either side of a material to be moved, or a plurality of rollers may provide support for material to be moved. A system of end caps with a driving mechanism such as gears, or the like may move material along the rollers. In an embodiment, a subset or all of the rollers may be freewheeling. In an embodiment, a roller may be an idler roller. Material may move along freewheeling rollers by gravity, inertia of the material, or the use of other driven roller cores.

Figure 5A:
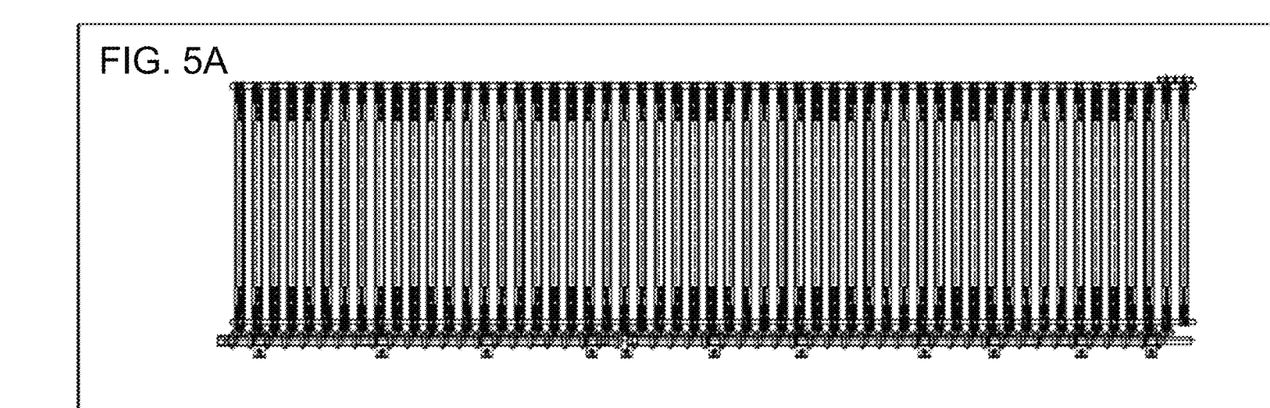
Figure 5B:
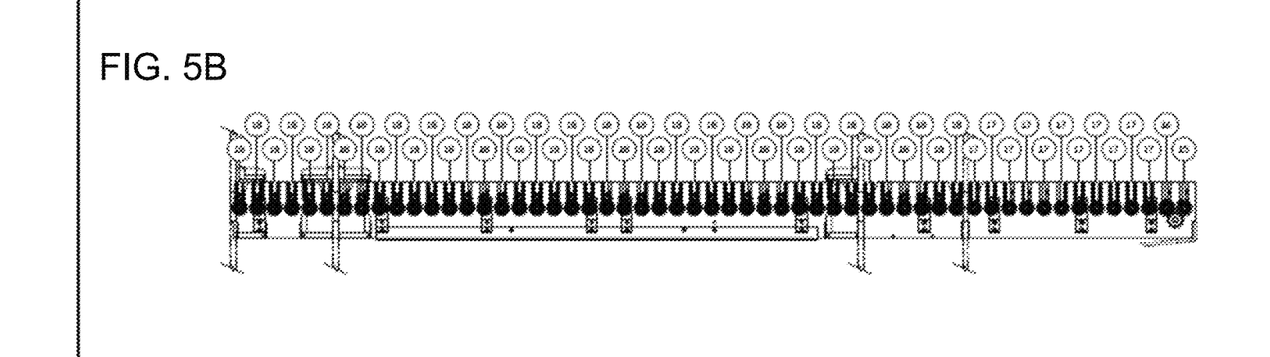

Referring to FIG. 5 A-B, a roller conveyor system with a plurality of roller cores in an embodiment is illustrated. FIG. 5A illustrates a top view of a conveyor system in an embodiment. The conveyor system of roller cores may be arranged in a parallel fashion, at angles to make turns, or any other configuration to move material. In an embodiment, rollers may be uniform throughout the conveyor system or the conveyor system may contain rollers of different attributes (see 17, 18, 19, & 20). FIG. 5B, illustrates a side view of a conveyor system with parallel roller cores.

Figure 6:
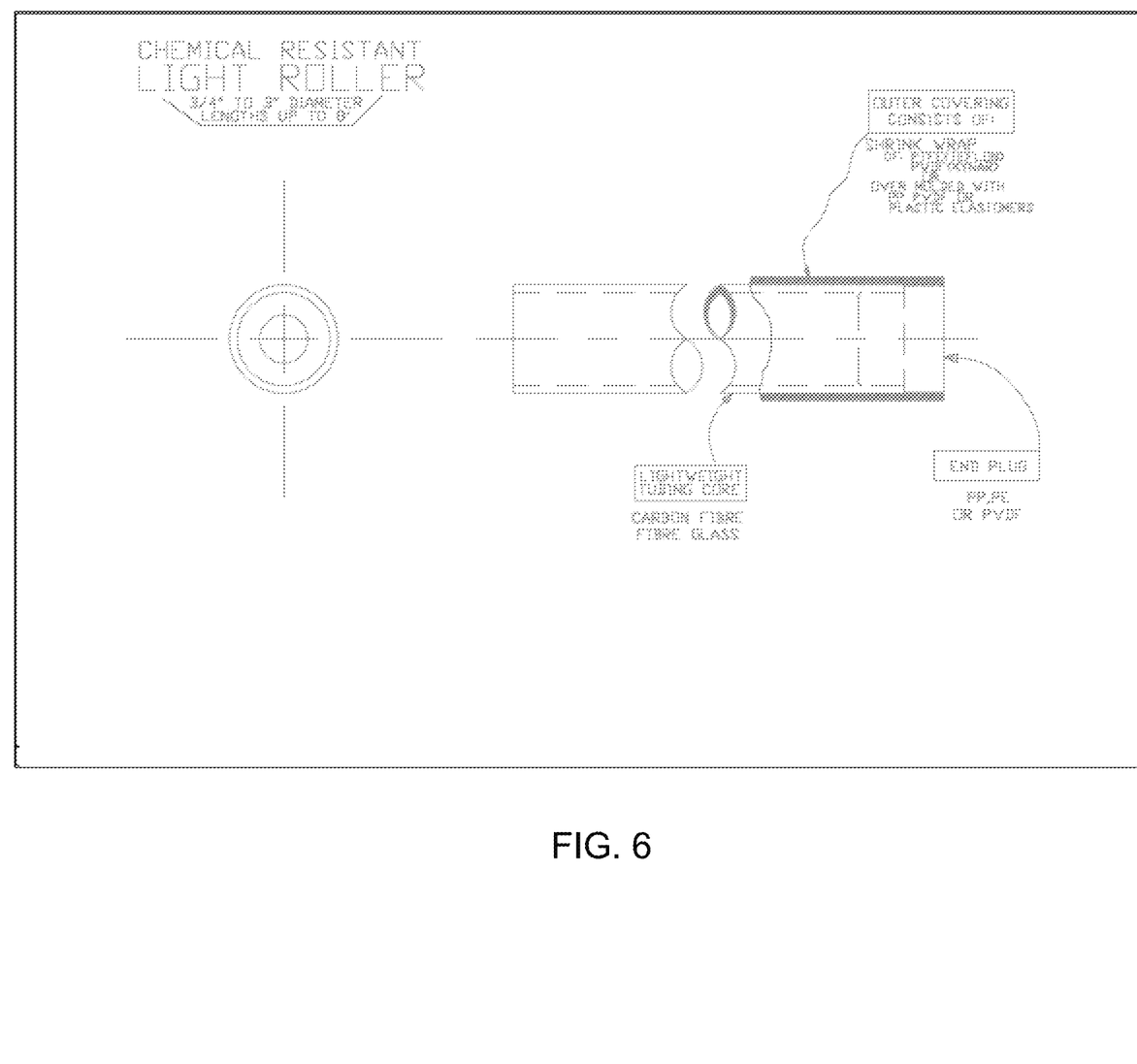
FIG. 6 illustrates a side view of an end and a front view of an embodiment.

FIG. 6 illustrates a side view or an end view of an embodiment. The end view illustrates a hollow tubular structure for the roller. As explained here throughout, the roller core may also be a solid core. Alternatively, the roller may include an insert that may be inserted or manufactured into or with the roller core. For example, where FIG. 6 illustrates a hollow portion, the hollow portion may be filled with an insert that may be of a different material than the roller core, for example, metal, different composite material, plastic, or the like. FIG. 6 also illustrates a front view of an embodiment with an end plug. As can be seen, the end plug may be inserted into the roller, for example, in the hollow portion of the roller core.

Figure 7:
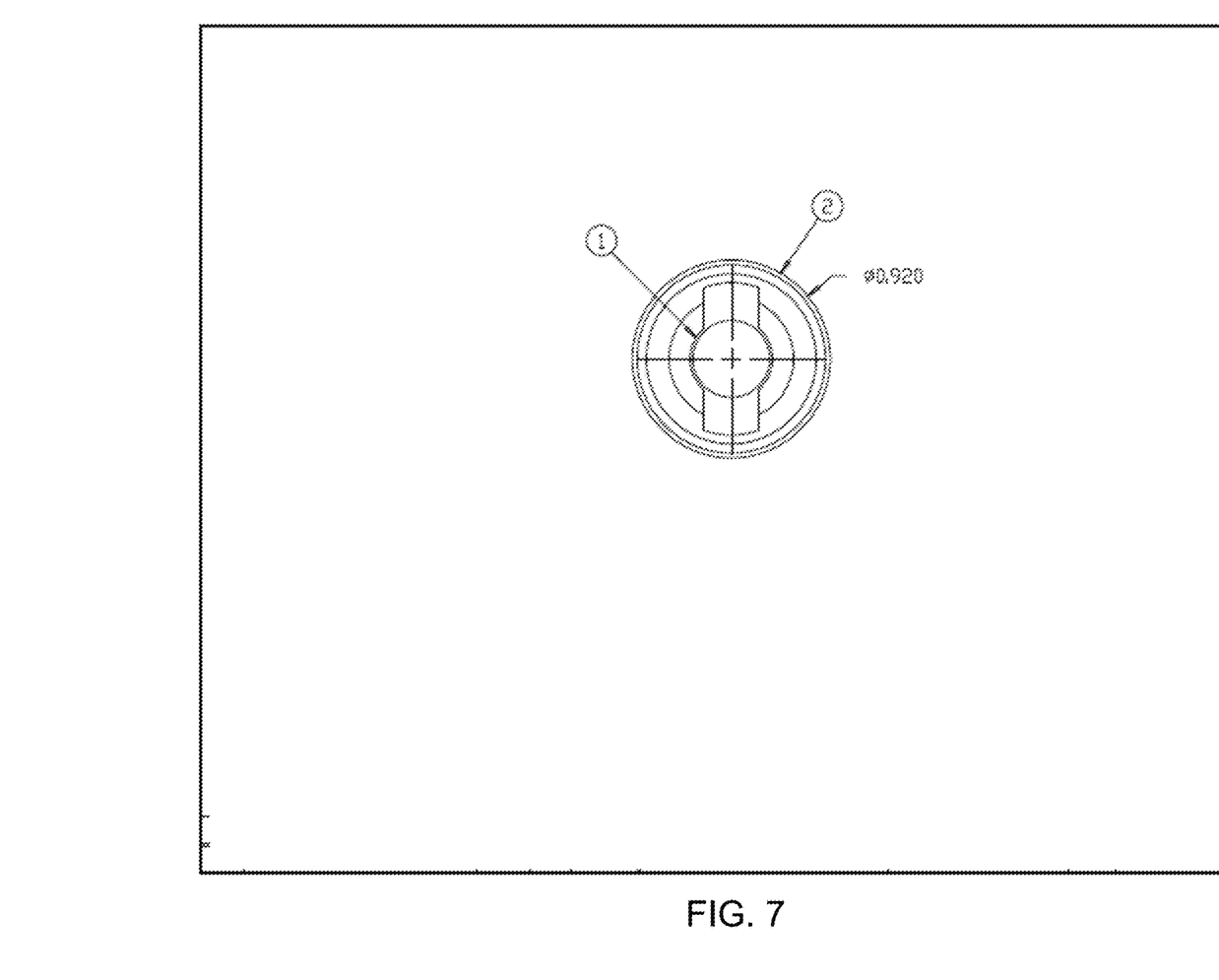
FIG. 7 illustrates a side view schematic of a roller embodiment.

Referring to FIG. 7, a cross section of a roller core of lightweight tubing material 1 with an outer surface material 2 in an embodiment is illustrated. As stated before, the illustrated dimension is merely an example and is not intended to be limiting. As previously discussed, the outer surface material may be manufactured as a film and applied to the roller core, may be an additional manufacturing step (e.g., the roller core is manufactured and a subsequent processing step includes application of the outer surface material, etc.), may be a sleeve that is slid over the roller core, or the like. In other words, the outer surface material may be shrink wrap, over molding, a sleeve, or the like.

The outer surface material may be made of different materials. For example, in the case of over molding the material may include polypropylene (PP), polyvinylidene fluoride (PVDF), plastic elastomer (PE), or the like. Over molding may be facilitated by placing the roller core into an injection molding machine wherein the outer surface material is injected into a chamber and upon the roller core. Other methods of over molding may be used. As another example, in the case of shrink wrap, the outer surface material of the roller core may be polytetrafluoroethylene (PTFE), polyvinylidene fluoride (PVDF), or the like. The outer surface material may be tapered, squared, or complement a channel or raised portion at an end of a roller. The outer surface material may be a shrink wrapped onto the roller core. In an embodiment, the outer surface material such as PTFE, PP, PVDF, PE, or the like may be manufactured in a tube-like sleeve then cut to length. The cut piece of outer surface material may then be placed upon the roller core. The outer surface material may then be heated to shrink wrap the outer surface material upon the roller tube. However, this is not required. For example, the outer surface material may just be a sleeve that is held into place based upon placement in the conveyor system. In an embodiment, the outer surface material may be a separate component to be used with any type of roller core. In an embodiment, the outer surface material may be sprayed, brushed, or even be a component of the core itself.

In an embodiment, the outer surface material may be compatible with corrosive chemistry. For example, the outer surface material may be compatible with a very strong acid (e.g. HCl), a very strong base (e.g. NaOH), or a range of both extreme acids and bases. In other words, either the surface material or the roller core material may be resistive to chemicals, resistive to thermal expansion, and/or resistive to other environmental conditions. In an embodiment, the outer surface material may facilitate the "sweeping" action of clearing a fluid off a material moving upon a roller. In an embodiment, the outer surface material may be textured upon the outer surface material's outer diameter.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A lightweight roller for conveying fragile or sensitive components while maintaining a long lifespan, comprising:
   a cylindrical roller core manufactured using a single lightweight composite material, the cylindrical roller having an outer surface, wherein the outer surface comprises a sleeve of soft and fluid resistant material with a uniform outer diameter, thereby lessening pressure exerted by the lightweight roller on the fragile or sensitive components, wherein the sleeve contacts the fragile or sensitive components, wherein the cylindrical roller core comprises a length that spans a majority of the length of the lightweight roller, wherein the lightweight roller comprises an over molded material over the outer surface of the cylindrical roller core and grinding the over molded material to a predetermined thickness;

the cylindrical roller core comprising a first end, a second end substantially opposite the first end, and an outer surface; and at least one end cap attached to at least one of the first end and the second end.

2. The lightweight roller of claim 1, wherein the cylindrical roller core is a hollow tube.

3. The lightweight roller of claim 1, wherein the lightweight composite material is a composite material selected from the group consisting of: carbon fiber, fiber glass, and graphene.

4. The lightweight roller of claim 1, wherein the lightweight composite material comprises a material that resists chemicals.

5. The lightweight roller of claim 1, wherein the over molded material is selected from the group consisting of polypropylene (PP), polyvinylidene fluoride (PVDF), and plastic elastomer (PE).

6. The lightweight roller of claim 1, further comprising a shrink wrap material covering the outer surface of the cylindrical roller core.

7. The lightweight roller of claim 6, wherein the shrink wrap material is selected from the group consisting of: polytetrafluoroethylene (PTFE) and polyvinylidene fluoride (PVDF).

8. The lightweight roller of claim 1, wherein the at least one end cap comprises an attachment mechanism for attaching the lightweight roller to a conveyor apparatus.

9. The lightweight roller of claim 1, further comprising a core insert within the cylindrical roller core.

10. A method of manufacturing a lightweight roller for conveying fragile or sensitive components while maintaining a long lifespan, comprising:

manufacturing a cylindrical roller core with a first end, a second end substantially opposite the first end, and an outer surface from a single lightweight composite material, the cylindrical roller having an outer surface, wherein the outer surface comprises a sleeve of soft and fluid resistant material with a uniform outer diameter, thereby lessening pressure exerted by the lightweight roller on the fragile or sensitive components, wherein the sleeve contacts the fragile or sensitive components, wherein the cylindrical roller core comprises a length that spans a majority of the length of the lightweight roller;

placing an over molded material over the outer surface of the cylindrical roller core and grinding the over molded material to a predetermined thickness; and attaching at least one end cap to at least one of the first end and the second end.

11. The method of manufacturing a lightweight roller of claim 10, wherein the over molded material is selected from the group consisting of polypropylene (PP), polyvinylidene fluoride (PVDF), and plastic elastomer (PE).

12. The method of manufacturing a lightweight roller of claim 10, further comprising placing a shrink wrap material over the outer surface of the cylindrical roller core.

13. The method of manufacturing a lightweight roller of claim 12, wherein the shrink wrap material is selected from the group consisting of:

polytetrafluoroethylene (PTFE) and polyvinylidene fluoride (PVDF).

14. The method of manufacturing a lightweight roller of claim 10, wherein the cylindrical roller core is a hollow tube.

15. The method of manufacturing a lightweight roller of claim 10, wherein the lightweight composite material is a composite material selected from the group consisting of: carbon fiber, fiber glass, and graphene.

16. The method of manufacturing a lightweight roller of claim 10, wherein the at least one end cap comprises an attachment mechanism for attaching the lightweight roller to a conveyor apparatus.

17. A lightweight conveyor roller system for conveying fragile or sensitive components while maintaining a long lifespan, comprising:

a conveyor roller device; and a plurality of cylindrical roller cores manufactured using a single lightweight composite material, each of the cylindrical rollers having an outer surface, wherein the outer surface comprises a sleeve of soft and fluid resistant material with a uniform outer diameter, thereby lessening pressure exerted by the lightweight roller on the fragile or sensitive components, wherein the sleeve contacts the fragile or sensitive components, wherein each of the cylindrical roller cores comprise a length that spans a majority of the length of a corresponding lightweight roller, wherein each of the cylindrical rollers comprises an over molded material over the outer surface of the cylindrical roller core and grinding the over molded material to a predetermined thickness;

each of the cylindrical roller cores comprising a first end, a second end substantially opposite the first end, and an outer surface; and a first end cap for each of the cylindrical roller cores, wherein the first end cap is attached to the first end of the corresponding cylindrical roller core;

a second end cap for each of the cylindrical roller cores, wherein the second end cap is attached to the second end of the corresponding cylindrical roller core;

wherein each of the first end caps and the second end caps comprise an attachment mechanism for attaching the cylindrical roller cores to a position of the conveyor roller device.

* * * * *